US012080739B2

(12) United States Patent
Innocent et al.

(10) Patent No.: US 12,080,739 B2
(45) Date of Patent: Sep. 3, 2024

(54) GLOBAL SHUTTER SENSOR SYSTEMS AND RELATED METHODS

(71) Applicant: SEMICONDUCTOR COMPONENTS INDUSTRIES, LLC, Phoenix, AZ (US)

(72) Inventors: Manuel H. Innocent, Wezemaal (BE); Tomas Geurts, Haasrode (BE); David T. Price, Gresham, OR (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 548 days.

(21) Appl. No.: 17/029,682

(22) Filed: Sep. 23, 2020

(65) Prior Publication Data
US 2022/0093667 A1    Mar. 24, 2022

(51) Int. Cl.
H01L 27/146    (2006.01)

(52) U.S. Cl.
CPC .... *H01L 27/14623* (2013.01); *H01L 27/1461* (2013.01); *H01L 27/1463* (2013.01); *H01L 27/14643* (2013.01); *H01L 27/14689* (2013.01)

(58) Field of Classification Search
None
See application file for complete search history.

(56) References Cited

U.S. PATENT DOCUMENTS

| | | | | |
|---|---|---|---|---|
| 2008/0297634 A1* | 12/2008 | Uya | ............ | H01L 27/14623 |
| | | | | 348/294 |
| 2014/0054737 A1* | 2/2014 | Okino | ............ | H01L 27/14685 |
| | | | | 438/73 |
| 2015/0035028 A1 | 2/2015 | Fan et al. | | |
| 2015/0129943 A1 | 5/2015 | Kato et al. | | |
| 2018/0145101 A1* | 5/2018 | Sano | ............ | H01L 27/14621 |
| 2021/0242251 A1* | 8/2021 | Kwag | ............ | H01L 27/14627 |
| 2022/0384496 A1* | 12/2022 | Cheng | ............ | H01L 27/14634 |
| 2022/0392944 A1* | 12/2022 | Tochigi | ............ | H01L 31/1075 |
| 2022/0415945 A1* | 12/2022 | Matsumura | ............ | H01L 27/14603 |

FOREIGN PATENT DOCUMENTS

WO    WO-2015115147 A1 *   8/2015   ....... H01L 27/14612

OTHER PUBLICATIONS

Brunelli et al.., "Selective and Confined Epitaxial Growth Development for Novel Nano-scale Electronic and Photonic Device Structures,", J. App. Phys. v. 126, 015703 (2019).
"III-V integration & devices," IBM Research Zurich, available at https://www.zurich.ibm.com/st/nanodevices/monolithicgrowth.html, last visited Sep. 4, 2020.
Nam, J.H., et al., "Germanium on Insulator (GOI) Structure Locally Grown on Silicon Using Hetero Epitaxial Lateral Overgrowth," ECS Transactions V. 45, No. 4 p. 203-208 (2012).

* cited by examiner

*Primary Examiner* — Nilufa Rahim
(74) *Attorney, Agent, or Firm* — Adam R. Stephenson, LTD.

(57) ABSTRACT

Implementations of a semiconductor device may include a photodiode included in a second epitaxial layer of a semiconductor substrate; light shield coupled over the photodiode; and a first epitaxial layer located in one or more openings in the light shield. The first epitaxial layer and the second epitaxial layer may form a single crystal.

20 Claims, 9 Drawing Sheets

Starting Material

Starting Material

GLOBAL SHUTTER SENSOR SYSTEMS AND RELATED METHODS

BACKGROUND

1. Technical Field

Aspects of this document relate generally to semiconductor devices, such as image sensor devices for cameras. More specific implementations involve global shutter sensors.

2. Background

Image sensors are used to translate electromagnetic radiation received into an electrical signal for further processing. Various image sensors are sensitive to various wavelengths of electromagnetic radiation. In various image sensors, a photodiode region is used to receive the electromagnetic radiation and convert it into a corresponding electrical signal.

SUMMARY

Implementations of a semiconductor device may include a photodiode included in a second epitaxial layer of a semiconductor substrate; light shield coupled over the photodiode; and a first epitaxial layer located in one or more openings in the light shield. The first epitaxial layer and the second epitaxial layer may form a single crystal.

Implementations of a semiconductor device may include one, all, or any of the following:

The photodiode may be a deep photodiode.

The light shield may be included of a dielectric and a metal.

The metal of the light shield may be encapsulated in an oxide.

The device may include a memory element included in the first epitaxial layer.

The device may include a vertical transfer gate electrically and physically coupled with the photodiode.

The device may include a shallow photodiode electrically and mechanically coupled with the photodiode.

Implementations of a semiconductor device may include a first epitaxial layer including in-pixel circuits and a plurality of shallow photodiodes; an opaque light shield formed on the first epitaxial layer, the opaque light shield including one or more openings; and a second epitaxial layer located in the one or more openings in the opaque light shield, the second epitaxial layer including a plurality of deep photodiodes.

Implementations of a semiconductor device may include one, all, or any of the following:

The opaque light shield may be recessed in the first epitaxial layer.

The first epitaxial layer and the second epitaxial layer may be a single crystal.

The in-pixel circuits may include one or more of a storage gate, a storage diode, and a storage capacitor.

The device may include a vertical transfer gate electrically and physically coupled with the plurality of deep photodiodes.

The plurality of shallow photodiodes may be electrically and physically coupled with the plurality of deep photodiodes.

Implementations of a method for forming a semiconductor device may include forming a plurality of recesses into a second epitaxial layer on a first side of a semiconductor substrate; forming a light shield with a plurality of openings therein into the plurality of recesses; and forming a first epitaxial layer on a first side of a semiconductor substrate over the plurality of recesses using the second epitaxial layer coupled with the semiconductor substrate as a seed to form a single crystal structure between the first epitaxial layer and the second epitaxial layer; and thinning the semiconductor substrate at a second side of the semiconductor substrate.

Implementations of a method of forming a semiconductor device may include one, all, or any of the following:

The method may include forming one or more openings in the semiconductor substrate.

The method may include depositing a sacrificial oxide into the plurality of recesses.

Forming a light shield further may include forming a plurality of trenches into the material of the second epitaxial layer; removing the sacrificial oxide to form a plurality of voids; and depositing a metal material into the plurality of voids and the plurality of trenches to form the light shield with the plurality of openings therein.

The method may include forming a plurality of shallow photodiodes in the first epitaxial layer; forming a plurality of deep photodiodes in the second epitaxial layer; and directly contacting at least one of the shallow photodiodes with at least one of the deep photodiodes.

Forming the first epitaxial layer further may include using one of epitaxial overgrowth or confined epitaxial growth.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor device will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor devices, and implementing components and methods, consistent with the intended operation and methods.

For global shutter sensors, an important performance metric is the parasitic light sensitivity of the storage node or the shutter efficiency. This metric quantifies the responsivity of the memory element compared to the responsivity of the photodiode. The responsivity of the memory element has to be minimized, which often means the memory element has to be shielded from light.

Figure 1:
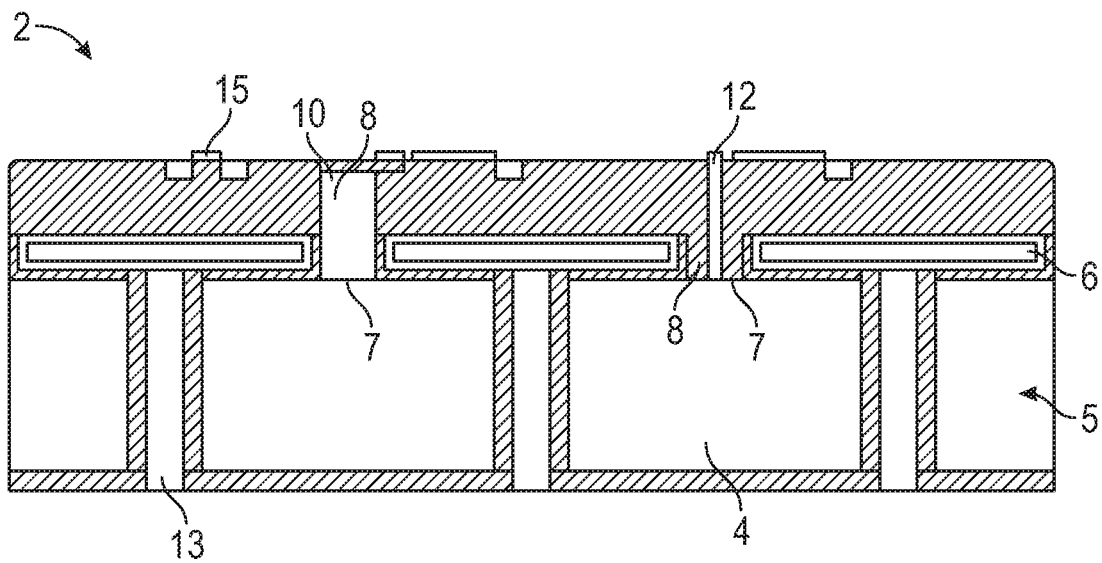
FIG. 1 is a cross sectional view of an implementation of a semiconductor device.

Referring to FIG. 1, an implementation of a semiconductor device 2 is illustrated. The device may be a light sensor, an image sensor, or any other sensor type capable of sensing electromagnetic radiation such as, by non-limiting example, visible light, infrared light, ultraviolet light, x-rays, microwave radiation, or any other electromagnetic radiation type. The semiconductor device 2 includes a deep photodiode 4 in a second epitaxial layer 5 of semiconductor substrate. As used herein, a deep photodiode is a photodiode structure that is formed to not touch the front side (first side in this document) of the wafer where transistor and other routing structures are located. An implementation of a shallow photodiode is illustrated as photodiode 10 in FIG. 1. As used herein, shallow photodiodes are photodiode structures that are formed to reach the front side (first side) of the wafer and interact with the transistor and other routing structures including transfer gates. While the photodiode illustrated on the left of FIG. 1 contains a shallow photodiode 10, the photodiode on the right does not, and so the deep photodiode 4 interacts with the transistors and routing structures on the front side via transfer gate 12.

In various implementations, the semiconductor substrate may include a wafer. In other implementations, the substrate may be a bulk semiconductor material. In some implementations, the semiconductor material of the substrate may include, by non-limiting example, silicon, germanium, silicon carbide, ruby, sapphire, silicon-on-insulator, or any other semiconductor material that is a single crystal. As illustrated, a light shield layer 6 is formed over second epitaxial layer 5. In various implementations, the material of the second epitaxial layer 5 may be the same material as the material of the semiconductor substrate, may be a different material, or may be chemically the same material but in a different crystalline form/crystal orientation than the material of the semiconductor substrate. In various implementations, the second epitaxial layer 5 is an epitaxial layer formed over the material of the semiconductor layer using any of the epitaxy methods disclosed herein. The light shield layer 6 has two openings 7 as illustrated. These openings may be formed by patterning the material of the light shield layer. In some implementations, the light shield layer 6 may have two or more openings to allow for growth of a second epitaxial layer 5. In various implementations, the light shield layer 6 may be an opaque material including a dielectric material and a metal. By non-limiting example, the dielectric in the light shield layer 6 may be an oxide, such, as, by non-limiting example, silicon dioxide, borophosphosilicate glass, glass, or any other oxide with dielectric properties. In some implementations, the light shield layer 6 may include an oxide, nitride, silicon nitride, a metal, any combination thereof, or any combination of the foregoing materials arranged in various layers. One particular implementation of the light shield layer may include oxide-tungsten-oxide. In some implementations, the metal of the light shield layer 6 may be encapsulated in the material of the oxide by being fully enclosed by the oxide material.

Still referring to FIG. 1, the implementation of a semiconductor device 2 includes a first epitaxial layer 8 located in the two of openings 7 of the light shield layer 6 and across the light shield layer in the doped regions illustrates in the shaded regions. The first epitaxial layer 8 is also grown from/grown using the material of the semiconductor substrate as the seed layer forming a single crystal material (or material with a single crystal structure) in the device. In various implementations, the material of the first epitaxial layer 8 is grown using the material of the second epitaxial layer 5 as a seed layer. However, in other implementations disclosed later in this document, the reverse is true and the second epitaxial layer is grown using the first epitaxial layer as a seed layer. The single crystal structure of the first and second epitaxial layers may help to reduce leakage currents compared to alternative approaches where two separate crystals are connected in a device. As previously discussed, the material of the first epitaxial layer may be chemically the same or chemically different than the material on which it is grown. The first epitaxial layer 8 includes memory/circuit elements formed therein or thereon (not shown). In various implementations the memory elements may include a storage gate, a storage diode, a storage capacitor, or any combination thereof. In some implementations, the first epitaxial layer 8 may also include in-pixel circuits formed therein. Connection to the deep photodiode 4 in the second epitaxial layer may be achieved through a shallow photodiode 10 formed in the material first epitaxial layer 8. Connection to the deep photodiode 4 may also be achieved through a vertical transfer gate 12 directly through the material of the semiconductor substrate. Semiconductor devices with the foregoing structure may have superior shutter efficiency including superior parasitic light sensitivity (parasitic sensitivity to light. The device 2 also includes trenches 13 formed through the second epitaxial layer 5 extending to the light shield layer 6. These trenches 13 provide isolation between the deep photodiodes (deep trench isolation structures which will be described herein).

As illustrated, the device includes front side devices 15 formed at the end of processing with corresponding wells formed into the material (in the device illustrated in FIG. 1, the wells are P-wells). Additional horizontally aligned transfer gate, storage gate, and floating diffusion devices are also included. During formation of the image sensor/device may be coupled to a handling wafer/carrier wafer on a side of the image sensor where the first epitaxial layer is located following growth of the epitaxial layers. During processing of the structure, the original substrate may then be thinned, the second layer of epitaxial material formed, followed by additional back side processing performed including deep trench isolation of the photodiodes and the addition of back side passivation to the deep photodiodes.

Figure 2:
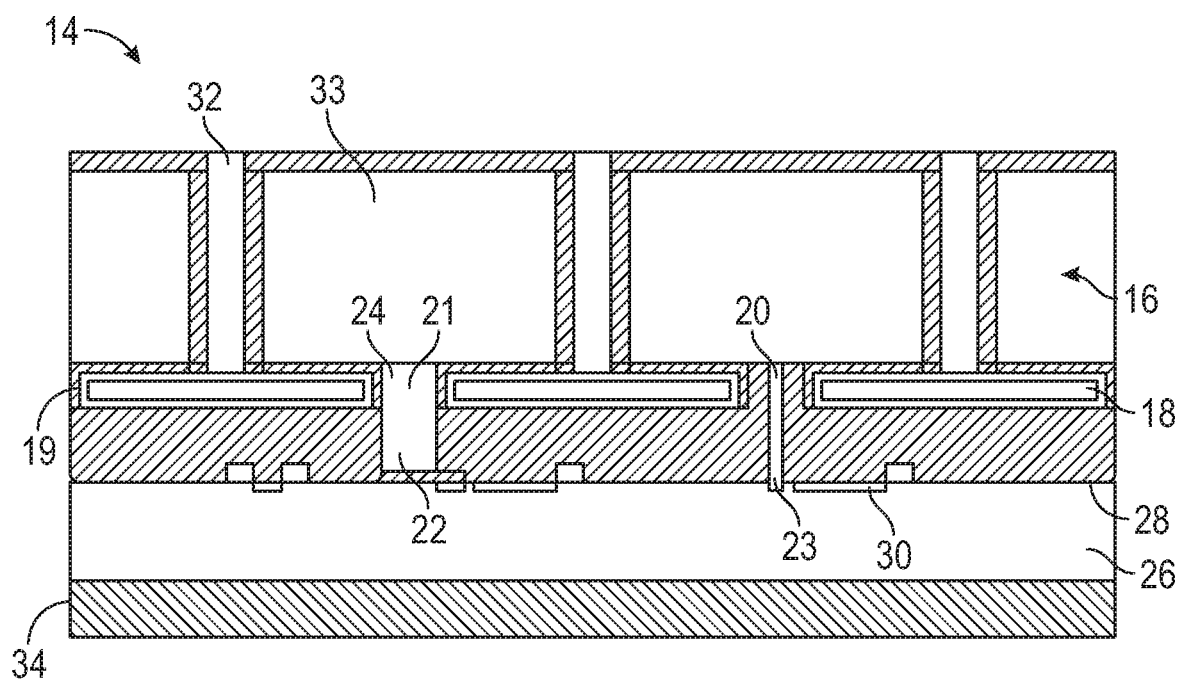
FIG. 2 is a cross sectional view of another implementation of a semiconductor device coupled with a handling wafer.

Referring to FIG. 2, another implementation of a semiconductor device 14 is illustrated in a reversed (flipped over) orientation from the implementation illustrated in FIG. 1. As illustrated, the semiconductor device 14 include a second epitaxial layer 16 and first epitaxial layer 22. The first epitaxial layer 22 includes in-pixel circuits and a photodiode and the shaded areas below light shield layer 18. In various implementations, the first epitaxial layer and/or the second epitaxial layer may be formed of silicon or germanium and may be the same material or a different material (or differently oriented material) than the material of the semiconductor substrate on which either is formed. The light shield layer 18 is optically opaque to decrease the encroachment of parasitic light into the structure of the device. In various implementations, the light shield layer may include an oxide-metal-oxide pattern like any disclosed in this document. Oxide 19 is formed around/extends around the metal layer of the light shield layer 18 to fully encapsulate the edges of the metal. As illustrated, the device also includes an opening/transfer gate opening 20 adjacent the light shield. While the use of a transfer gate opening 20 is illustrated in the device illustrated in FIG. 2, in some device implementations, only shallow photodiodes may be used, and so in some versions no openings may need to be formed into the material of the substrate following the formation of the recesses to form the light shield layer. In some method implementations like the one disclosed at the end of this document, no openings may be formed at all as the light shield layer may be formed without using recessing. As previously discussed and as will be discussed further in this document, in some implementations, the first epitaxial layer 22 is grown first and in others the second epitaxial layer 16 is grown second.

Referring to FIG. 2, the image sensor device 14 includes metal stack/backend metallization 26 on the second side of the device over the front side devices. A handling wafer 34 is illustrated temporarily coupled to the backend metallization 26 to provide support to the device after thinning of the semiconductor material of the semiconductor substrate. Electrical connection to the deep photodiodes 33 is achieved through a shallow photodiode 22 or through a vertical transfer gate 23. The device also includes deep trench isolation 32 (DTI) between the deep photodiodes 33. The trenches 32 can be formed through etching through the second epitaxial layer in various implementations and may be constructed as described hereafter. In other implementations, the trenches 32 may formed through template assisted growth of the second epitaxial layer 16 so the space of the trenches never includes epitaxial material. In various implementations, the first and second epitaxial layers can be grown through, by non-limiting example, template assisted selective epitaxy, lateral overgrowth epitaxy followed by etching, or through molecular beam epitaxy. In implementations including lateral overgrowth epitaxy, etching/planarizing may be performed through chemical mechanical processing (CMP).

Figure 3:
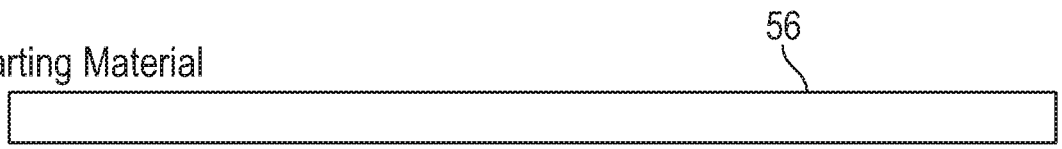
FIG. 3 is a cross sectional view of an implementation of a starting material including a first epitaxial layer.
Figure 4:
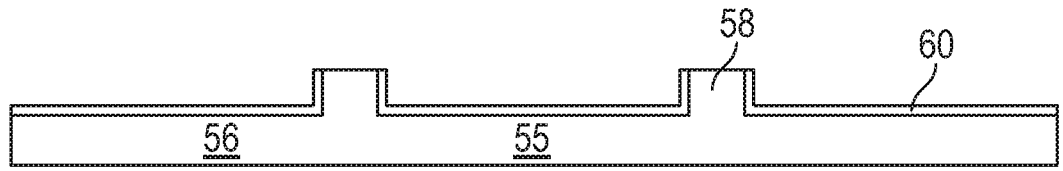
FIG. 4 is a cross sectional view of an implementation of a passivation layer formed on the first epitaxial layer.
Figure 5:
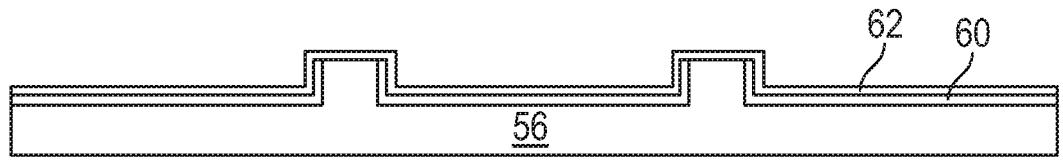
FIG. 5 is a cross sectional view of an implementation of an oxide layer formed on the passivation layer.
Figure 6:
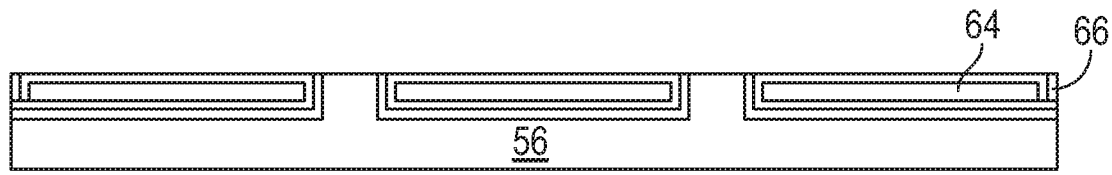
FIG. 6 is a cross sectional view of an implementation of a light shield deposited over the first epitaxial layer.

Referring to FIGS. 3-11, an implementation of a semiconductor device following various steps of another implementation of a method of forming a semiconductor device is illustrated. In various method implementations, in-pixel circuits are formed in a first epitaxial layer. The method begins with a semiconductor substrate 56 as the starting material as illustrated in FIG. 3. In various implementations, the starting material may include bulk silicon with an n-type epitaxial layer already formed thereon which will be referred to later on as the second epitaxial layer. Referring to FIG. 4, a plurality of etch shield locations are covered with a material that resists etching of the semiconductor substrate 56, followed by patterning of the semiconductor substrate 56 to form a plurality of recessed areas 55 and raised areas 58. An implant is then carried out into the material of the recessed areas forming implanted regions 60. Referring to FIG. 5, the method includes forming an oxide or nitride 62 over the implanted regions 60 and the raised areas 58. Following the deposition of the oxide/nitride layer 62, the material of an opaque light shield is formed into the recessed areas as illustrated in FIG. 6 forming a light shield layer 64. Forming the light shield layer 64 includes etching the material of the metal then adding a top side oxide/nitride layer 66 over the material of the light shield layer 64.

Figure 7:
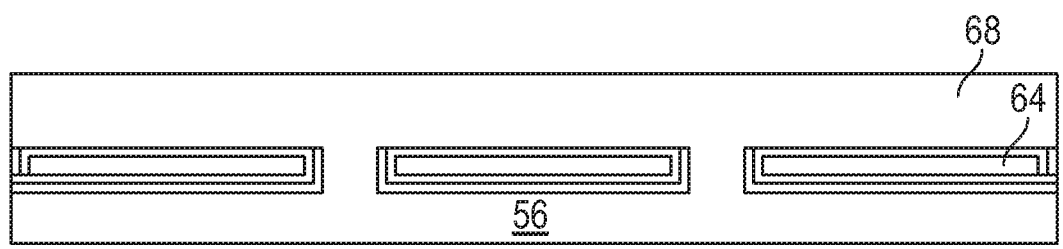
FIG. 7 is a cross sectional view of an implementation of a second epitaxial layer deposited over the light shield.

Following formation of the light shield layer 64, as illustrated in FIG. 7, the method includes growing a first epitaxial layer 68 over the light shield layer 64. In various implementations, the first epitaxial layer 68 may be formed using lateral overgrowth as illustrated in FIG. 7. Lateral overgrowth includes growing the first epitaxial layer 68 without boundaries or constraints (bulk formation). As illustrated, the first epitaxial layer 68 is grown over the dielectric material of the light shield layer 64. Chemical mechanical polishing (CMP) is used to flatten the surface of the first epitaxial layer 68 following the growth process. In various implementations, the boundaries between crystals grown from different seed locations could result in crystal faults when the growth areas grow into each other. In various method implementations, these fault regions can be etched away or filled with oxide as needed.

Figure 8:
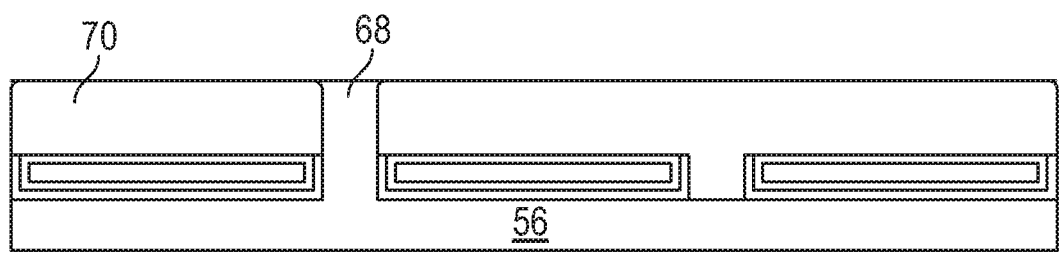
FIG. 8 is a cross sectional view of an implementation of a second epitaxial layer after doping.

The method further includes p-doping the first epitaxial layer via implantation to create a P-well implant region 70 as illustrated by the boundary lines added in FIG. 8. In other implementations, doping can be introduced into the material of the first epitaxial layer 68 during epitaxial growth in various implementations. In other implementations, the first epitaxial layer 68 may be implanted using gas immersion laser doping (GILD).

Figure 9:
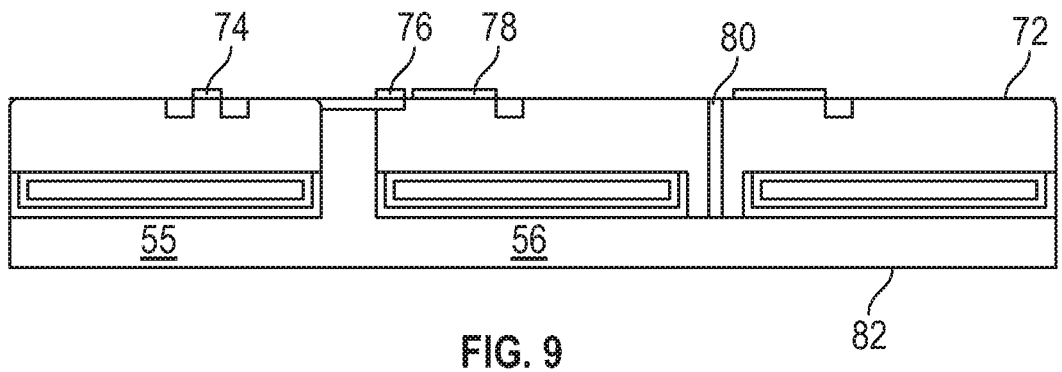
FIG. 9 is a cross sectional view of an implementation of a semiconductor device after front side processing.

The method also includes various front side processing steps to form various devices (like any disclosed in this document) on the surface of the first epitaxial layer 68 as illustrated in FIG. 9. Front side processing may include forming front side devices 74 including storage gates 78 and transfer gates 76. Front side processing also includes forming a vertical transfer gate 80 through the first epitaxial layer to eventual connect with the deep photodiodes that will be subsequently formed. The second side 72 of the device is then coupled with a handling wafer 84 to facilitate backside grinding or thinning of the bulk semiconductor material 56 on the first side 82 of the device to reach the thickness illustrated in FIGS. 9 and 10. In the method implementation illustrated in FIG. 10, the material of the semiconductor substrate has been substantially removed except for the material of the second epitaxial layer 55.

Figure 10:
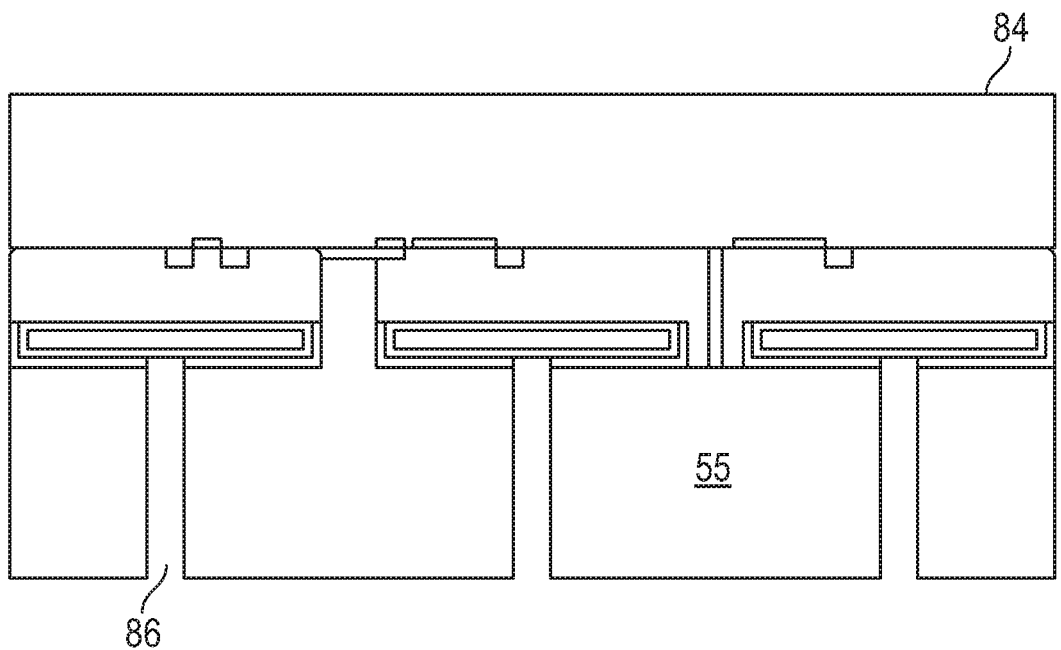
FIG. 10 is a cross sectional view of an implementation of a semiconductor device after etching of the first epitaxial layer.
Figure 11:
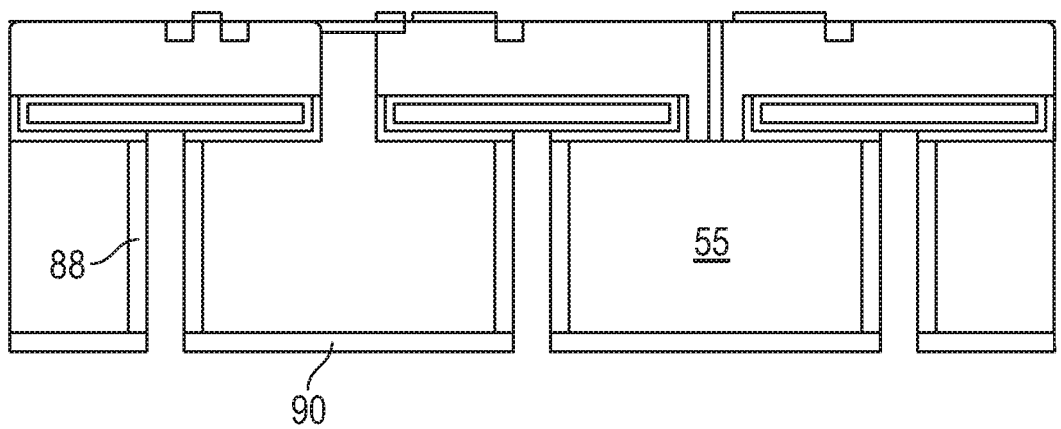
FIG. 11 is a cross sectional view of an implementation of a semiconductor device after adding a passivation layer to the first epitaxial layer.

Referring to FIG. 10, the device coupled with the handling wafer 84 is illustrated and the material of the second epitaxial layer 55 is also illustrated. In the implementation in FIG. 10, the method includes forming trenches 85 through the second epitaxial layer 55. In various implementations, the trenches 85 may be formed through a backside deep trench isolation (BDTI) process. The method also includes forming a passivation implant 88 of the BDTI trenches 86, metal/oxide filling of the BDTI trenches 86 followed by back side passivation 90 of the second epitaxial layer 55. In various implementations, the back side passivation may include p-type passivation. Referring to FIG. 11, the semiconductor device is illustrated after backside processing.

Referring to FIGS. 12-20, another implementation of a semiconductor device following various steps of an implementation of a method of forming a semiconductor device is illustrated. In this method, a sacrificial oxide layer is deposited to hold a space for the light shield between growth of the first epitaxial layer and the second epitaxial layer. The sacrificial oxide layer is later removed and the material of the optically opaque light shield is deposited through the trenches formed through BDTI.

Figure 12:
FIG. 12 is a cross sectional view of an implementation of a starting material including a first epitaxial layer.
Figure 13:
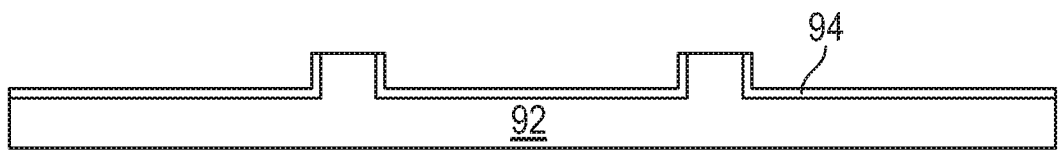
FIG. 13 is a cross sectional view of an implementation of a passivation layer formed on the first epitaxial layer.

Referring to FIG. 12, the starting material 92 is illustrated. The starting material 92 may include a silicon substrate with N-doped epitaxy layer formed thereon to form a second epitaxial layer (not separately shown in FIG. 12). As previously illustrated, the surface of the silicon substrate is etched to form a plurality of recesses into the substrate material 92 using a plurality of etch shield locations each located between the plurality of recesses. In various implementations, the method includes marking the etch shield location and implanting a passivation layer 94 on the first side of the plurality of recesses. Referring to FIG. 13, the passivation layer 94 formed is illustrated.

Figure 14:
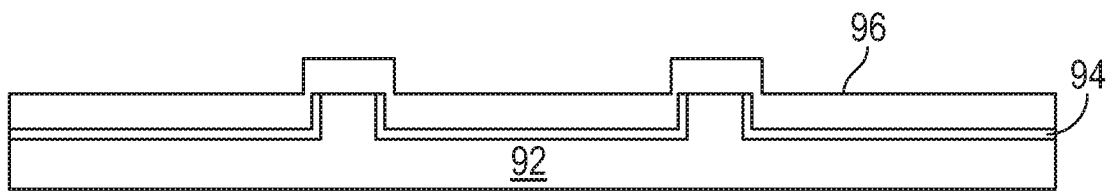
FIG. 14 is a cross sectional view of an implementation of an oxide layer formed on the passivation layer.
Figure 15:
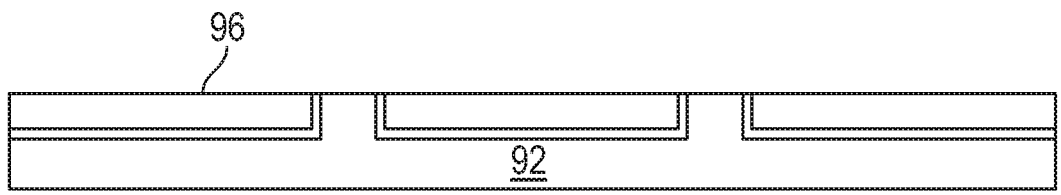
FIG. 15 is a cross sectional view of an implementation of a sacrificial oxide layer deposited over the first epitaxial layer.

The method also includes forming a sacrificial oxide layer 96 over the plurality of recesses and passivation layer 94 as illustrated in FIG. 14. The sacrificial oxide layer 96 will hold a space for a light shield layer within the layers of the device. FIG. 15 illustrates the sacrificial oxide layer following a planarization process to level or smooth the layer of the sacrificial oxide 96. In various implementations, planarization may be performed using CMP.

Figure 16:
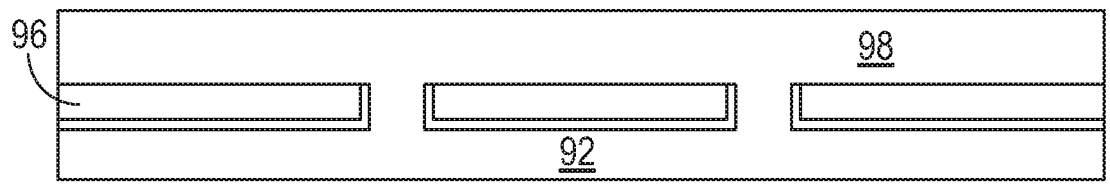
FIG. 16 is a cross sectional view of an implementation of a second epitaxial layer grown over the sacrificial oxide.

The method further includes growing a first epitaxial layer 98 over the sacrificial oxide 96. In this implementation, the first epitaxial layer 98 is grown using a lateral overgrowth process using the exposed silicon in between the areas of sacrificial oxide as the seed layer. Referring to FIG. 16, the semiconductor device is illustrated after growth of the first epitaxial layer 98 over the sacrificial oxide 96.

Figure 17:
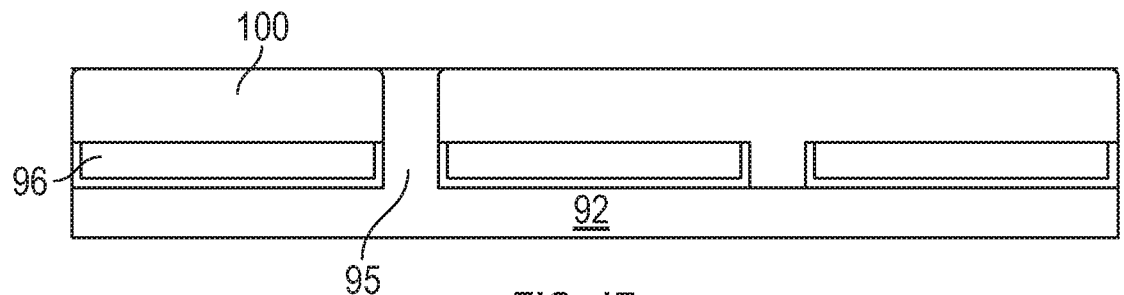
FIG. 17 is a cross sectional view of an implementation of a second epitaxial layer after doping.
Figure 18:
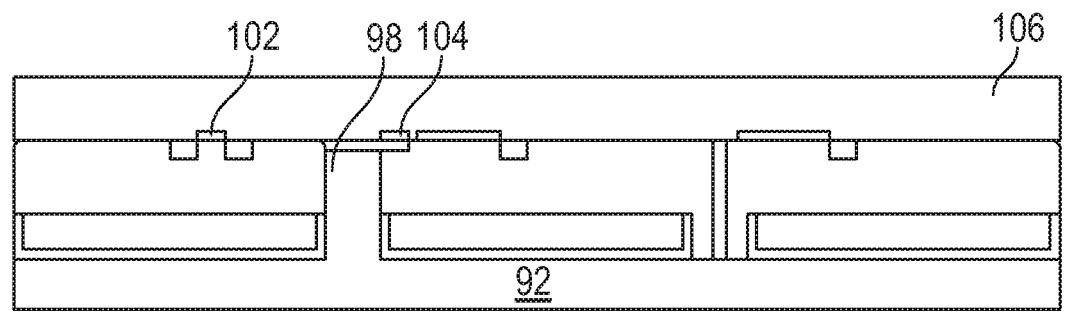
FIG. 18 is a cross sectional view of an implementation of a semiconductor device after front side processing.

The method also includes doping the first epitaxial layer with p dopants to form a p-well region. In various implementations, the p-well may be doped using an implanting into the material of the first epitaxial layer 98. In other implementations, the p-well may be doped during the growth period of the second epitaxial layer using any of the methods disclosed herein. Referring to FIG. 17, the p-wells 100 are illustrated over the sacrificial oxide 96. As illustrated the p-wells 100 do not extend into the openings 95 of the growth control layer 96. The method also includes front side processing including forming front side devices 102 and transfer gates 104. As illustrated in FIG. 18, the method includes coupling the device to a handling wafer 106 over the back end metal layers that form the interconnects between devices (not shown in FIG. 18, but shown as layer 136 in FIG. 23) on the first side of the P-wells 100 and first epitaxial layer 98. The method also includes thinning to remove the material of the semiconductor substrate down to the second epitaxial layer.

Figure 19:
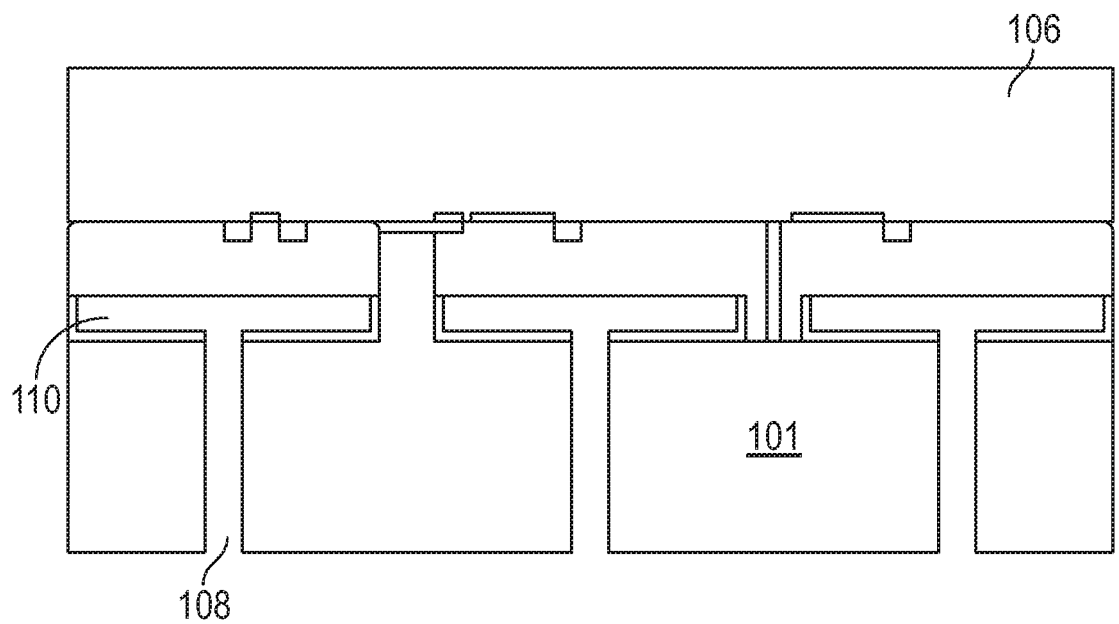
FIG. 19 is a cross sectional view of an implementation of a semiconductor device after the sacrificial oxide is removed.

Referring to FIG. 19, the semiconductor device is illustrated following thinning of the semiconductor substrate material while being supported by the handling wafer 106 down to the second epitaxial layer 101. Once the second epitaxial layer 101 has been exposed, the method implementations forms deep trench isolation structures therein from a second side of the second epitaxial layer 101 to the sacrificial oxide 96. The sacrificial oxide 96 is removed either subsequently or simultaneously through etching leaving void 110.

Figure 20:
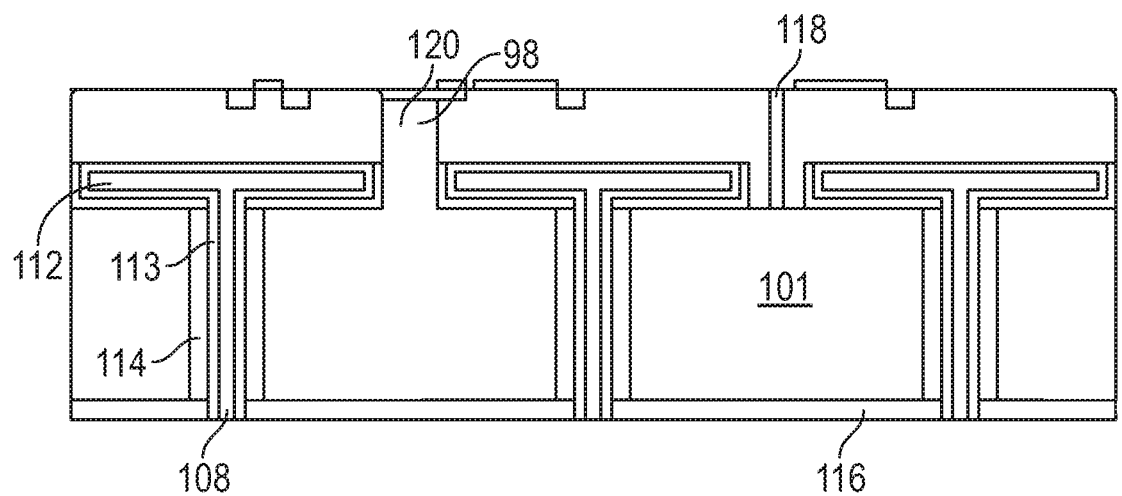
FIG. 20 is a cross sectional view of an implementation of a semiconductor device after a light shield is implanted and after passivation of the first epitaxial layer.

Referring to FIG. 20, the device is illustrated after final processing steps. The method includes forming the optically opaque material of the light shield layer 112 through the process of filling the trenches 108. As illustrated in FIG. 20, the same oxide material applied to the sides of the trenches 108 is used to form an oxide layer around the void 110 and then the metal material used to fill the remaining area of the trench 108 also forms the material of the light shield layer 112. In various implementations, the light shield layer may include oxide and tungsten wherein the oxide 113 is extends around the sides of the tungsten. The method may also include a passivation implant 114 along the walls of the trenches 108. Final processing steps also include forming a passivation layer 116 on the second side of the second epitaxial layer 101. Doping of the second epitaxial layer to form the deep photodiodes may be done during the growth of the epitaxial layer in various implementations. In other implementations, doping to form the deep photodiodes may also be performed through laser implantation either after formation or after exposure using backgrinding. In various implementations, the second epitaxial layer may include in-pixel circuits and the deep photodiodes. In other implementations, the second epitaxial layer may include only the deep photodiodes. Electrical connection to the deep photodiodes may be achieved through formation of a vertical transfer gate 118. In various implementations, electrical connection to the deep photodiodes may also be achieved through formation of a shallow photodiode, in-pixel circuits, or a combination thereof in the first epitaxial layer 98.

Figure 21:
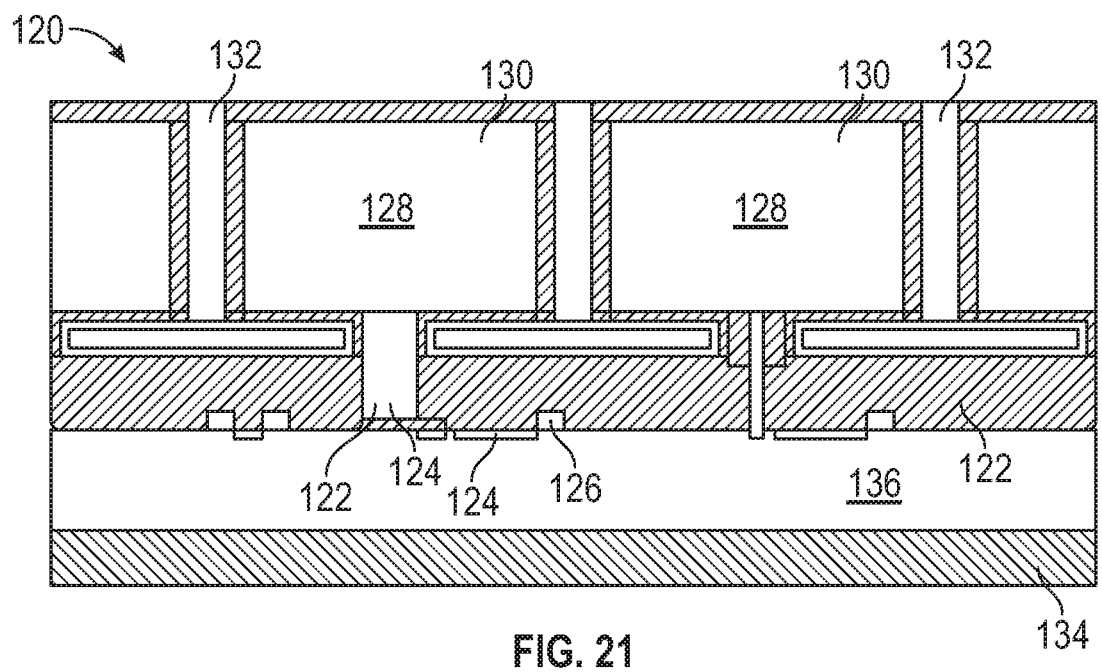
FIG. 21 is a cross sectional view of another implementation of a semiconductor device.

Referring to FIG. 21, another implementation of a semiconductor device 120 is illustrated. Like those previously illustrated in this document, the device includes a first epitaxial layer 122 in which a plurality of devices 126 have been formed. As illustrated, the first epitaxial layer 122 includes a shallow photodiode 124 similar to the previously illustrated implementations. The device 120 also includes a second epitaxial layer 128 that include deep photodiodes 130 separated by deep trench isolation structures 132. In the implementation illustrated in FIG. 21, a handling wafer 134 is coupled to backside metallization layer 136 as in those implementations disclosed herein. The semiconductor device 120, while being similar in structure to those illustrated herein is formed using a different implementation of a method of forming the various structures which is illustrated in FIGS. 21-27.

Figure 22:
FIG. 22 is a cross sectional view of a semiconductor substrate.
Figure 23:
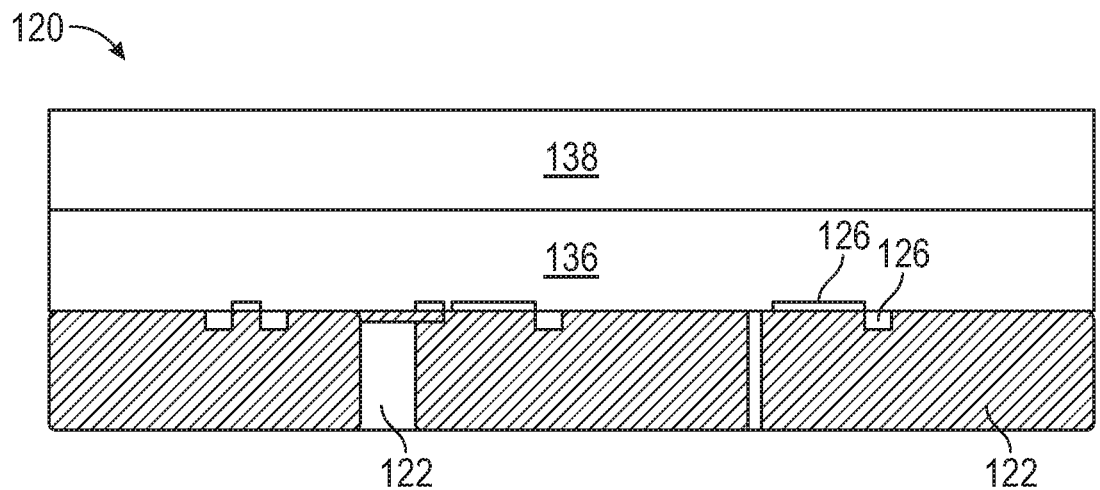
FIG. 23 is a cross sectional view of a semiconductor substrate with devices and a backend metal layer formed therein with a first epitaxial layer formed thereon.

Referring to FIG. 22, in an implementation method of forming a semiconductor device a starting material is utilized, which may be any semiconductor substrate type disclosed herein. In a particular method implementation, the starting material 138 is a silicon substrate with an N-doped epitaxial layer formed thereon. Referring to FIG. 23, this N-doped epitaxial layer is the first epitaxial layer 122. Various device fabrication method operations like those already disclosed in this document have been carried out (doping, etching, patterning, etc.) to form the plurality of devices 126 and the backend metal layer 136 illustrated in the semiconductor device 120 illustrated in FIG. 23. In the implementation in FIG. 23, the material of the silicon substrate 138 is illustrated prior to grinding.

Figure 24:
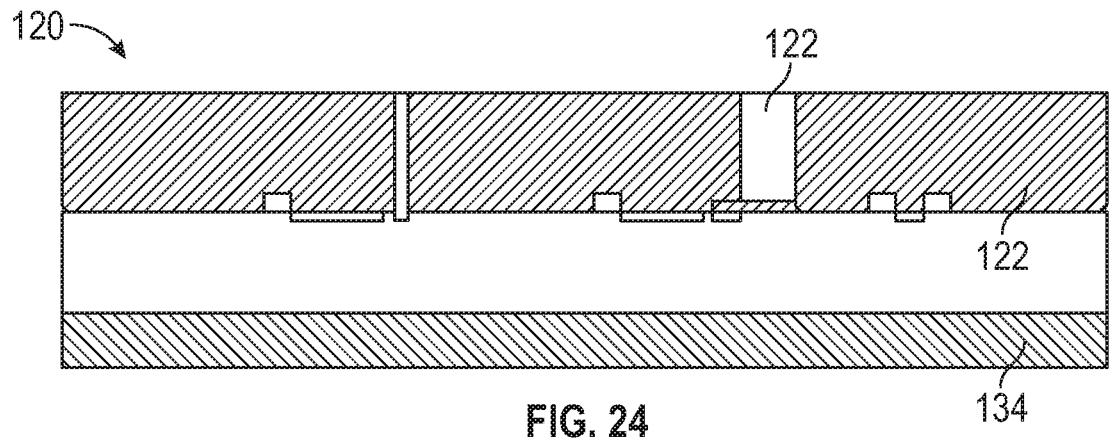
FIG. 24 is a cross sectional view of the semiconductor substrate following backgrinding.
Figure 25:
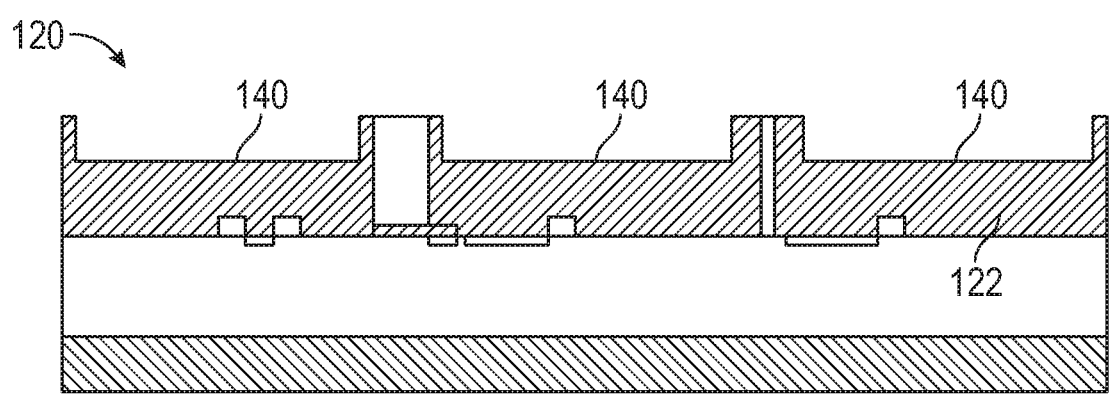
FIG. 25 is a cross sectional view of the semiconductor device following forming recesses in the first epitaxial layer.
Figure 26:
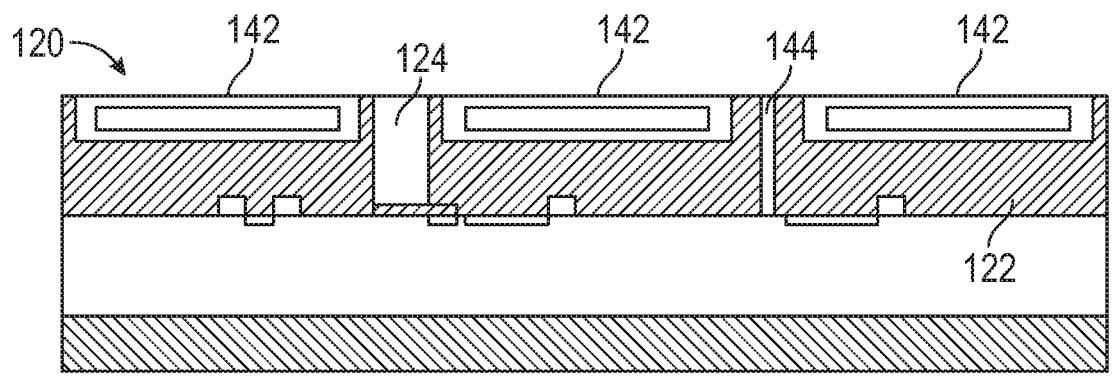
FIG. 26 is a cross sectional view of the semiconductor device following formation of a light shield layer in the recesses.

Referring to FIG. 24, the semiconductor device 120 is illustrated following grinding away of the material of the silicon substrate while the device 120 is supported by handling wafer 134. As illustrated, the material of the silicon substrate has been removed down to the first epitaxial layer 122. Following thinning, FIG. 25 illustrates the semiconductor device 120 following patterning and etching of recesses 140 into the material of the first epitaxial layer 122. As illustrated in FIG. 26, into the recesses 140 is formed a light shield layer 142 which may be any type of light shield layer 142 disclosed herein that includes a plurality of openings which accommodate the shallow photodiode 124 and transfer gate 144 structures in the first epitaxial layer 122. The light shield layer 142 may be formed using any of the methods disclosed herein modified for a situation where a second epitaxial layer is not yet present.

Figure 27:
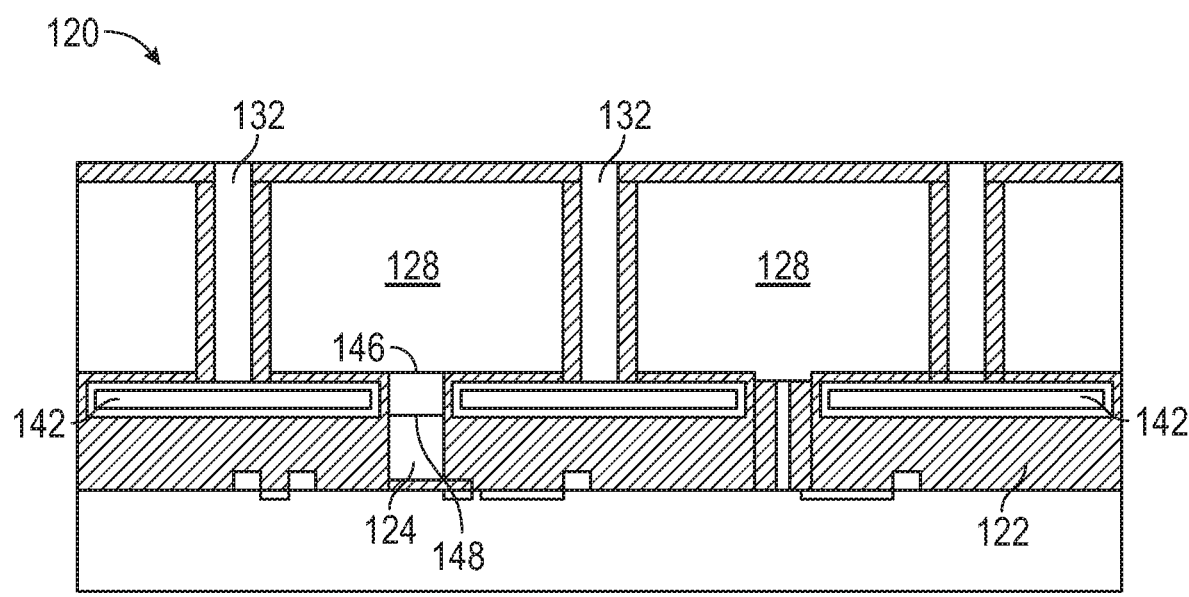
FIG. 27 is a cross sectional view of the semiconductor device following growth of a second epitaxial layer.

Referring to FIG. 27, the device 120 is illustrated following growth of second epitaxial layer 128 and formation of the deep trench isolation structures 132 is illustrated. Initially, after formation of the light shield layer 142, the second epitaxial layer 128 is grown over the first epitaxial layer 122 using the first epitaxial layer 122 as a seed material. In this way, the material of both the first epitaxial layer 122 and the second epitaxial layer 128 form a single crystal material. Where the second epitaxial layer is grown using epitaxial overgrowth, the deep trench isolation structures are formed by first etching the trenches through the second epitaxial layer 128 followed by application of a passivation material and filling of the trenches with a dielectric material like any disclosed in this document. However, in various method implementations, the second epitaxial layer 128 can be grown using template assisted epitaxy (confined epitaxial growth) to create the trenches during the growth of the second epitaxial layer 128. In such an implementation, no etching or patterning processes may be needed and the method implementation then completes formation of the deep trench isolation structures 132 through forming a passivation material followed by a formation of a dielectric material to fill the remaining space in the trenches. In either implementation of the method, various planarization steps may be carried out to planarize the surface of the passivated second epitaxial layer 128.

As illustrated in FIG. 27, the epitaxial growth of the second epitaxial layer 128 may begin at the level of point 148 or may start at the level of point 146 depending on whether the shallow photodiode 124 is protected during the etching/patterning process used to form the light shield layer 142. In either situation, the material of the first epitaxial layer 122 is used as the seed material for the growth of the second epitaxial layer 128. Following the formation of the structure of the second epitaxial layer 128, in some implementations, the method includes removing the handling wafer 134 and singulation of the various semiconductor devices 120 into various sensing devices for further processing. In other implementations, the handling wafer 134 may not be removed and may remain during singulation becoming part of the device.

In the method implementation illustrated in FIGS. 22-27, the method differs principally in that the first epitaxial layer 122 is grown first followed by the second epitaxial layer 128. While in the method illustrated in FIG. 22-27, the light shield layer 142 is fully formed prior to the growth of the second epitaxial layer 122, in other method implementations, the second epitaxial layer 128 may be grown first, and then the formation of the light shield layer may be completed along with the process of forming the deep trench isolation structures using a process like that disclosed in this document and illustrated in FIGS. 16-20. A wide variety of various method implementations and process options may be constructed and applied using the principles disclosed in this document.

In the method implementations illustrated in FIGS. 3-11 and 12-20 the light shield layers have been formed through etching into the material of the silicon substrate or epitaxial layer on the silicon substrate. In another method implementation, however, no etching into the material of the silicon substrate may be initially carried out. Instead, a blanket layer of light shield material(s) or a sacrificial oxide layer may be applied to the flat surface of the silicon substrate. This blanket light shield layer/sacrificial oxide layer is then patterned using any of the patterning methods disclosed in this document to form openings down to the silicon substrate or epitaxial layer. The first (or second) epitaxial layer can then be grown beginning from the bottom of the openings to form the single crystal material desired. In the method implementation where the blanket light shield layer is used, the light shield material and structure may be any disclosed in this document. In the method implementation where a sacrificial oxide is used, the light shield layer may then be formed using the method steps illustrated in FIGS. 17-20. The remaining method steps to form the remaining parts of the device may be the same as those disclosed in this document.

In places where the description above refers to particular implementations of light sensors and implementing components, sub-components, methods and sub-methods, it should be readily apparent that a number of modifications may be made without departing from the spirit thereof and that these implementations, implementing components, sub-components, methods and sub-methods may be applied to other light sensors.

What is claimed is:

1. A semiconductor device comprising:
a photodiode comprised in a second epitaxial layer of a semiconductor substrate;
a light shield coupled over the photodiode; and
a first epitaxial layer located in one or more openings in the light shield;
wherein the first epitaxial layer and the second epitaxial layer form a single crystal.

2. The device of claim 1, wherein the photodiode is a deep photodiode.

3. The device of claim 1, wherein the light shield is comprised of a dielectric and a metal.

4. The device of claim 3, wherein the metal of the light shield is encapsulated in an oxide.

5. The device of claim 1, further comprising a memory element comprised in the first epitaxial layer.

6. The device of claim 1, further comprising a vertical transfer gate electrically and physically coupled with the photodiode.

7. The device of claim 2, further comprising a shallow photodiode electrically and mechanically coupled with the deep photodiode, wherein a width of the shallow photodiode is less than a width of the deep photodiode.

8. A semiconductor device comprising:
   a first epitaxial layer comprising in-pixel circuits and a plurality of shallow photodiodes;
   an opaque light shield formed on the first epitaxial layer, the opaque light shield comprising one or more openings; and
   a second epitaxial layer located in the one or more openings in the opaque light shield, the second epitaxial layer comprising a plurality of deep photodiodes;
   wherein the first epitaxial layer is coupled over a surface of the opaque light shield facing a front side of the semiconductor device.

9. The device of claim 8, wherein the opaque light shield is recessed in the second epitaxial layer.

10. The device of claim 8, wherein the first epitaxial layer and the second epitaxial layer are a single crystal.

11. The device of claim 8, wherein the in-pixel circuits comprise one or more of a storage gate, a storage diode, and a storage capacitor.

12. The device of claim 8, further comprising a vertical transfer gate electrically and physically coupled with the plurality of deep photodiodes.

13. The device of claim 8, wherein the plurality of shallow photodiodes is electrically and physically coupled with the plurality of deep photodiodes.

14. The device of claim 8, wherein the opaque light shield is between a portion of the first epitaxial layer and a portion of the second epitaxial layer, wherein the portion of the first epitaxial layer is directly over the portion of the second epitaxial layer.

15. The device of claim 8, wherein a width of an entire shallow photodiode of the plurality of shallow photodiodes is less than a width of a deep photodiode of the plurality of deep photodiodes and wherein the width of the entire shallow photodiode fits within a width of an opening of the one or more openings in the opaque light shield.

16. A semiconductor device comprising:
   a photodiode comprised in a second epitaxial layer of a semiconductor substrate;
   a light shield coupled over the photodiode; and
   a first epitaxial layer coupled over the light shield;
   wherein the first epitaxial layer and the second epitaxial layer form a single crystal; and
   wherein the light shield is between the first epitaxial layer and the second epitaxial layer.

17. The device of claim 16, wherein the photodiode is a deep photodiode.

18. The device of claim 16, wherein the light shield is comprised of a dielectric and a metal.

19. The device of claim 16, further comprising a vertical transfer gate electrically and physically coupled with the photodiode.

20. The device of claim 16, wherein the first epitaxial layer comprises a shallow photodiode, wherein a width of the shallow photodiode is less than a width of the photodiode.

* * * * *